(12) United States Patent
Tzou et al.

(10) Patent No.: US 12,495,562 B2
(45) Date of Patent: Dec. 9, 2025

(54) SEMICONDUCTOR DEVICE AND FABRICATION METHOD THEREOF

(71) Applicant: Vanguard International Semiconductor Corporation, Hsinchu (TW)

(72) Inventors: Chen-Dong Tzou, Taipei (TW); Chih-Cherng Liao, Hsinchu (TW); Chia-Hao Lee, Hsinchu County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 618 days.

(21) Appl. No.: 17/947,160

(22) Filed: Sep. 18, 2022

(65) Prior Publication Data

US 2024/0097050 A1   Mar. 21, 2024

(51) Int. Cl.
*H10D 8/60* (2025.01)
*H10D 62/10* (2025.01)
*H10D 62/832* (2025.01)

(52) U.S. Cl.
CPC .......... *H10D 8/605* (2025.01); *H10D 62/106* (2025.01); *H10D 62/115* (2025.01); *H10D 62/8325* (2025.01)

(58) Field of Classification Search
None
See application file for complete search history.

(56) References Cited

U.S. PATENT DOCUMENTS

| | | | |
|---|---|---|---|
| 10,985,248 B2 | 4/2021 | Leendertz | |
| 11,011,606 B2 | 5/2021 | Meiser | |
| 2006/0209887 A1 | 9/2006 | Bhalla | |
| 2014/0159053 A1* | 6/2014 | Chen | H10D 30/635 |
| | | | 257/77 |
| 2018/0308975 A1* | 10/2018 | Ohse | H10D 84/146 |
| 2020/0111874 A1* | 4/2020 | Meiser | H10D 64/513 |

FOREIGN PATENT DOCUMENTS

| | | |
|---|---|---|
| CN | 111200022 A | 5/2020 |
| WO | 03/019623 A2 | 3/2003 |

* cited by examiner

*Primary Examiner* — Nishath Yasmeen
(74) *Attorney, Agent, or Firm* — Winston Hsu (57) ABSTRACT

A semiconductor device includes a trench disposed in an epitaxial layer on a substrate. A gate structure is disposed in the trench and includes upper and lower conductive portions. A dielectric isolation portion is disposed between the upper and lower conductive portions. A dielectric liner is disposed in the trench and has an opening on the bottom surface of the trench. The opening is filled up with a part of the lower conductive portion. A portion of the epitaxial layer and the lower conductive portion construct a Schottky barrier diode. A doped region is disposed in the epitaxial layer, under the bottom surface of the trench and on one side of the lower conductive portion. The portion of the epitaxial layer and a portion of the doped region are in contact with the lower conductive portion.

12 Claims, 10 Drawing Sheets

SEMICONDUCTOR DEVICE AND FABRICATION METHOD THEREOF

BACKGROUND OF THE INVENTION

1. Field of the Invention

The present disclosure relates generally to semiconductor technology, and more particularly to semiconductor devices including a vertically embedded Schottky barrier diode and fabrication methods thereof.

2. Description of the Prior Art

Metal-oxide-semiconductor field-effect-transistors (MOSFETs) are common power transistors used in integrated circuits, and typically operated under high voltage and high current conditions. MOSFETs may include a horizontal structure such as a laterally-diffused metal-oxide-semiconductor (LDMOS) field-effect-transistor (FET), and a vertical structure such as a trench gate MOSFET. For the trench gate MOSFET, a gate is disposed in a trench, which has the advantages of reducing the size of the element unit and reducing the parasitic capacitance thereof. However, the conventional trench gate MOSFETs still cannot fully satisfy the various requirements in power electronic applications, such as the requirements for the on-state resistance (Ron), the breakdown voltage and the switching loss.

SUMMARY OF THE INVENTION

In view of this, the present disclosure provides semiconductor devices and fabrication methods thereof, which include a vertically embedded Schottky barrier diode (SBD) integrated in a split-gate trench vertically double-diffused metal-oxide-semiconductor field-effect-transistor (VD MOSFET). The semiconductor devices of the present disclosure not only have the advantages of reducing the on-state resistance (Ron), reducing the gate-to-drain capacitance (Cgd) and enhancing the breakdown voltage (BV) without increasing the cell pitch, but also can reduce the reverse recovery charge (Qrr) and reduce the switching power loss (Psw), which are beneficial for the applications of the semiconductor devices while operated under the conditions of high voltage and high frequency electrical signals.

According to an embodiment of the present disclosure, a semiconductor device is provided and includes a substrate, an epitaxial layer, a trench, a gate structure, a dielectric isolation portion, a dielectric liner, and a first doped region. The epitaxial layer has a first conductivity type and is disposed on a first surface of the substrate. The trench is disposed in the epitaxial layer. The gate structure is disposed in the trench and includes an upper conductive portion and a lower conductive portion. The dielectric isolation portion is disposed between the upper conductive portion and the lower conductive portion. The dielectric liner is disposed in the trench and surrounds the gate structure. The dielectric liner has an opening located on the bottom surface of the trench, and the opening is filled up with a part of the lower conductive portion. The lower conductive portion and a portion of the epitaxial layer construct a Schottky barrier diode. The first doped region has a second conductivity type and is disposed in the epitaxial layer. The first doped region is located under the bottom surface of the trench and on one side of the lower conductive portion. The aforementioned portion of the epitaxial layer and a portion of the first doped region both are in contact with the lower conductive portion.

According to an embodiment of the present disclosure, a method of fabricating a semiconductor device is provided and includes the following steps. A substrate is provided and an epitaxial layer is formed on a first surface of the substrate, where the epitaxial layer has a first conductivity type. A first doped region and a second doped region are formed in the epitaxial layer, where the first doped region and the second doped region have a second conductivity type. A trench is formed in the epitaxial layer, where the first doped region and the second doped region are exposed through the bottom surface of the trench. A first dielectric layer is conformally formed on the sidewalls and the bottom surface of the trench. A first spacer and a second spacer are formed on the first dielectric layer and located on two opposite sidewalls of the trench. The first dielectric layer is etched by using the first spacer and the second spacer as a mask to form an opening, where a portion of the epitaxial layer, a portion of the first doped region and a portion of the second doped region are exposed by the opening. A lower conductive portion is formed in the trench and fills up the opening, where the lower conductive portion is in contact with the aforementioned portion of the epitaxial layer. In addition, a dielectric isolation portion and an upper conductive portion are formed in the trench, where the upper conductive portion and the lower conductive portion are separated from each other by the dielectric isolation portion.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "under," "lower," "over," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Furthermore, as disclosed herein, the terms "coupled to" and "electrically connected to" include any directly and indirectly electrical connecting means. Therefore, if it is described in this document that a first component is coupled or electrically connected to a second component, it means that the first component may be directly connected to the second component, or may be indirectly connected to the second component through other components or other connecting means.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

The present disclosure relates to a semiconductor device including a vertically embedded Schottky barrier diode (SBD) integrated in a split-gate trench vertically double-diffused metal-oxide-semiconductor field-effect-transistor (split-gate trench VDMOSFET) and a fabrication method thereof. A gate structure of the semiconductor device includes an upper conductive portion and a lower conductive portion separated from each other and disposed in a trench. The lower conductive portion and a portion of an epitaxial layer located directly under the lower conductive portion construct a Schottky barrier diode. In addition, at least one doped region or a plurality of doped regions separated from each other is disposed in the epitaxial layer and under the bottom surface of the trench. The aforementioned portion of the epitaxial layer is disposed between these doped regions, and the conductivity type of these doped regions is opposite to the conductivity type of the epitaxial layer. These doped regions may be referred to as shielding regions. The semiconductor devices of the embodiments of the present disclosure have the advantages of not increasing the cell pitch, reducing the on-state resistance (Ron), reducing the gate-to-drain capacitance (Cgd), and increasing the breakdown voltage (BV), etc. In addition, the reverse recovery charge (Qrr) and the switching power loss (Psw) of the semiconductor devices are also reduced by the vertically embedded Schottky barrier diode. Moreover, the aforementioned multiple doped regions (shielding regions) can further reduce the electric field of a gate oxide layer, the gate-to-drain coupling area and the gate-to-drain capacitance (Cgd), and also protect the Schottky contact, thereby facilitating the applications of the semiconductor devices operated under the conditions of high voltage and high frequency electrical signals.

Figure 1:
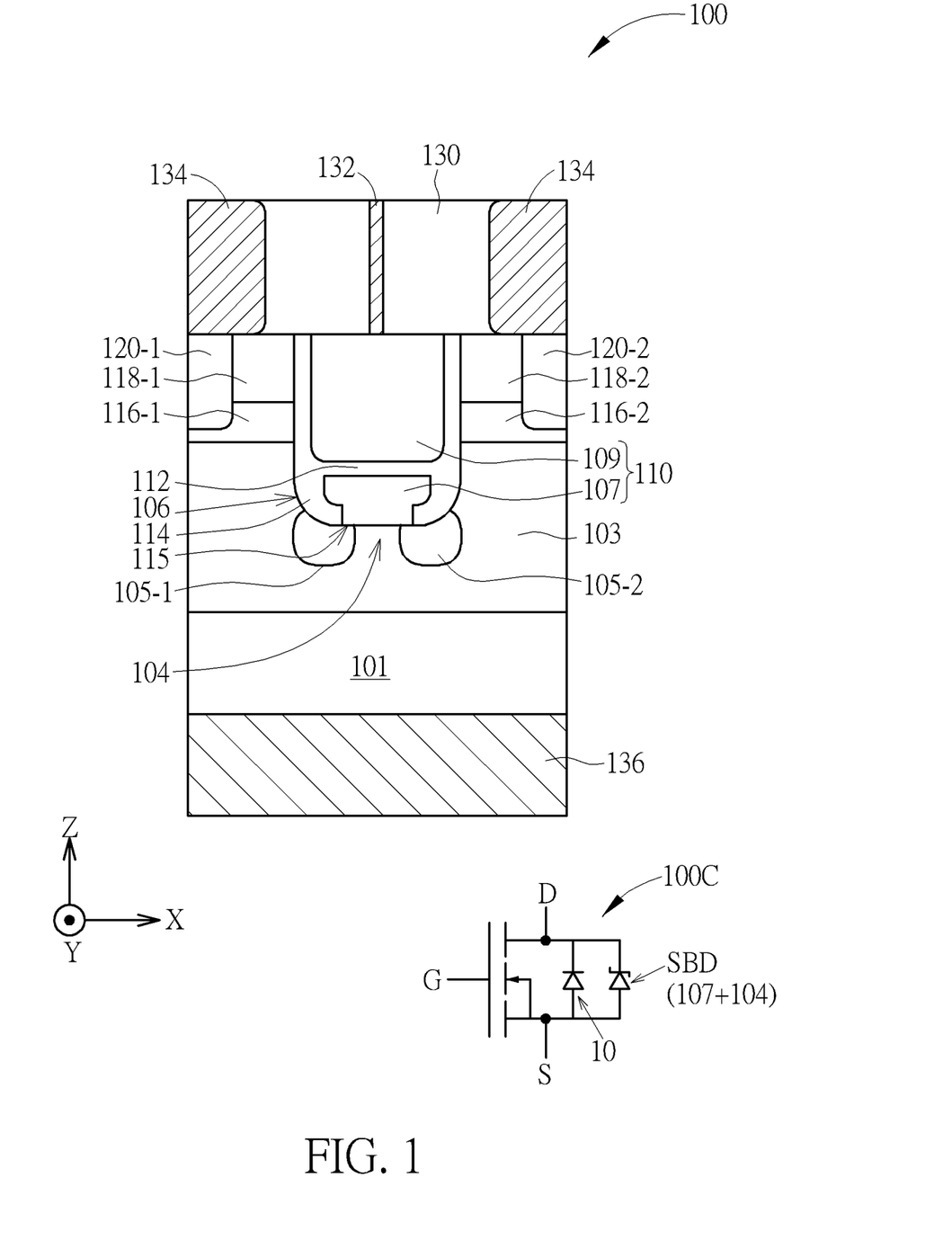
FIG. 1 shows a schematic cross-sectional view and an equivalent circuit diagram of a semiconductor device according to an embodiment of the present disclosure.

FIG. 1 shows a schematic cross-sectional view and an equivalent circuit diagram of a semiconductor device 100 according to an embodiment of the present disclosure. As shown in FIG. 1, in one embodiment, the semiconductor device 100 includes a substrate 101. The material of the substrate 101 is, for example, silicon, silicon carbide (SiC), aluminum nitride (AlN), gallium nitride (GaN) or other suitable semiconductor materials, where a 4H-type single crystal silicon carbide (4H—SiC) substrate has various advantages of high voltage resistance, heat resistance, reducing energy loss, etc., and is suitable for power devices. An epitaxial layer 103 is formed on a first surface such as the top surface of the substrate 101. The epitaxial layer 103 has a first conductivity type such as an n-type epitaxial layer. The material of the epitaxial layer 103 is, for example, silicon carbide (SiC), monocrystalline silicon or polysilicon. The n-type dopant of the epitaxial layer 103 is, for example, nitrogen (N) or phosphorus (P). A trench 106 is formed in the epitaxial layer 103 and extended from the top surface of the epitaxial layer 103 to a position in the depth of the epitaxial layer 103. A gate structure 110 is disposed in the trench 106 and includes an upper conductive portion 109 and a lower conductive portion 107. A dielectric isolation portion 112 is also disposed in trench 106 and between the upper conductive portion 109 and the lower conductive portion 107, such that the upper conductive portion 109 and the lower conductive portion 107 are vertically separated from each other. In addition, a dielectric liner 114 is also disposed in the trench 106 to surround the gate structure 110. The dielectric liner 114 has an opening 115 located on the bottom surface of the trench 106. The opening 115 is filled up with a part of the lower conductive portion 107, and the part of the lower conductive portion 107 is in contact with a portion 104 of the epitaxial layer 103.

In addition, at least one offset doped region is disposed in the epitaxial layer 103 and under the bottom surface of the trench 106. The at least one offset doped region includes, for example, a first doped region 105-1 and a second doped region 105-2. The central axis of each offset doped region in a Z-axis direction is laterally shifted away in an X-axis direction from the central axis of the lower conductive portion 107 in the Z-axis direction. The first doped region 105-1 and the second doped region 105-2 have a second conductivity type opposite to the first conductivity type, for example p-type doped regions. The p-type dopant of the first doped region 105-1 and the second doped region 105-2 is, for example, boron (B) or aluminum (Al). The first doped region 105-1 and the second doped region 105-2 are laterally separated from each other, located on two opposite sides of the lower conductive portion 107, respectively, and also on two opposite sides of the opening 115. The aforementioned portion 104 of the epitaxial layer 103 is located between the first doped region 105-1 and the second doped region 105-2. In addition, a portion of the first doped region 105-1 and a portion of the second doped region 105-2 are each in contact with a portion of the lower conductive portion 107.

In some embodiments, the material of the upper conductive portion 109 is polysilicon, the material of the lower conductive portion 107 is Schottky metal or doped polysilicon such as p-type polysilicon, and the material of the epitaxial layer 103 is silicon carbide. In other embodiments, the material of the lower conductive portion 107 is Schottky metal, and the material of the epitaxial layer 103 is silicon carbide, monocrystalline silicon or polysilicon. The Schottky metal is, for example, tantalum (Ta), titanium (Ti), tungsten (W), molybdenum (Mo), nickel (Ni), gold (Au), iridium (Ir), platinum (Pt), tungsten carbide (WC), nickel silicide ($Ni_2Si$) or alloys thereof. According to the embodiments of the present disclosure, the work function of the material of the lower conductive portion 107 is greater than the work function of the material of the epitaxial layer 103, so that a heterojunction is generated between the lower conductive portion 107 and the portion 104 of the epitaxial layer 103. Therefore, the lower conductive portion 107 and the portion 104 of the epitaxial layer 103 construct a Schottky barrier diode (SBD) that is vertically embedded in the semiconductor device 100.

Still referring to FIG. 1, the semiconductor device 100 further includes a first well region 116-1 and a second well region 116-2 disposed in the epitaxial layer 103, and located on two opposite sides of the trench 106, respectively. The first well region 116-1 and the second well region 116-2 have the second conductivity type, for example, p-well regions. The first well region 116-1 and the second well region 116-2 may be extended from the top surface of the epitaxial layer 103 to slightly higher than the bottom surface of the upper conductive portion 109, or may be slightly lower than or level with the bottom surface of the upper conductive portion 109. The first well region 116-1 and the second well region 116-2 are used as body regions of the semiconductor device 100. In addition, the semiconductor device 100 further includes a first source region 118-1 and a second source region 118-2, which are disposed in the first well region 116-1 and the second well region 116-2, respectively. The first source region 118-1 and the second source region 118-2 have the first conductivity type, for example, n-type heavily doped regions ($N^+$ doped regions). The semiconductor device 100 further includes a first heavily doped region 120-1 and a second heavily doped region 120-2, which are disposed in the first well region 116-1 and the second well region 116-2, respectively, and also adjacent to the first source region 118-1 and the second source region 118-2, respectively. The first heavily doped region 120-1 and the second heavily doped region 120-2 have the second conductivity type, for example p-type heavily doped regions ($P^+$ doped regions). The first source region 118-1, the second source region 118-2, the first heavily doped region 120-1 and the second heavily doped region 120-2 each is extended from the top surface of the epitaxial layer 103 to a position in the depth of the epitaxial layer 103. The bottom surfaces of the first heavily doped region 120-1 and the second heavily doped region 120-2 may be lower than the bottom surfaces of the first source region 118-1 and the second source region 118-2.

Still referring to FIG. 1, the semiconductor device 100 further includes an interlayer dielectric layer 130 covering the top surface of the epitaxial layer 103. A gate contact 132 is disposed in the interlayer dielectric layer 130 and electrically coupled to the upper conductive portion 109 of the gate structure 110. The upper conductive portion 109 may be used as a control gate. A source contact 134 is disposed in the interlayer dielectric layer 130 and electrically coupled to the first source region 118-1 and the first heavily doped region 120-1. Another source contact 134 is electrically coupled to the second source region 118-2 and the second heavily doped region 120-2. In addition, the semiconductor device 100 further includes a drain electrode 136 disposed on a second surface such as the bottom surface of the substrate 101. FIG. 1 also shows the equivalent circuit 100C of the semiconductor device 100. The upper conductive portion 109 of the gate structure 110 is a gate G in the equivalent circuit 100C, the first source region 118-1 and the second source region 118-2 are a source S in the equivalent circuit 100C, and the drain electrode 136 is a drain D in the equivalent circuit 100C. The gate G, the source S and the drain D constitute a vertically double-diffused metal-oxide-semiconductor field-effect-transistor (VDMOSFET). In addition, an PN junction is formed by the first heavily doped region 120-1 and the first well region 116-1 with the epitaxial layer 103 to constitute a body diode 10 in the equivalent circuit 100C, and an PN junction is also formed by the second heavily doped region 120-2 and the second well region 116-2 with the epitaxial layer 103 to constitute the body diode 10 in the equivalent circuit 100C. Two ends of the body diode 10 are electrically connected to the source S and the drain D, respectively. In addition, the lower conductive portion 107 and the portion 104 of the epitaxial layer 103 constitute a Schottky barrier diode SBD in the equivalent circuit 100C. Two ends of the Schottky barrier diode SBD are electrically connected to the source S and the drain D, respectively. Furthermore, the lower conductive portion 107 is electrically coupled to the source contact 134, and the Schottky barrier diode SBD and the body diode 10 in the equivalent circuit 100C are electrically connected with each other in parallel.

In the embodiments of the present disclosure, during the operation of the semiconductor device 100, when the semiconductor device 100 is forward biased (a drain voltage Vd>a source voltage Vs), the lower conductive portion 107 and the portion 104 of the epitaxial layer 103 will be reverse biased. At this time, a reverse bias voltage is applied to the first doped region 105-1, the second doped region 105-2 and the portion 104 of the epitaxial layer 103, thereby causing the depletion region between the first doped region 105-1, the second doped region 105-2 and the portion 104 of the epitaxial layer 103 to be increased, so as to avoid the leakage current flowing from the epitaxial layer 103 to the lower conductive portion 107. Moreover, in order to prevent the current from flowing from the epitaxial layer 103 to the lower conductive portion 107 while the semiconductor device 100 is forward biased (Vd>Vs), the space between the first doped region 105-1 and the second doped region 105-2 may be adjusted according to the actual requirements, such that the depletion region formed between the first doped region 105-1 and the second doped region 105-2 may occupy a part or all of the portion 104 of the epitaxial layer 103.

Since the Schottky barrier diode SBD is a unipolar element and the body diode 10 of a bipolar element, the turn-off speed of the Schottky barrier diode SBD is faster than that of the body diode 10. According to the embodiments of the present disclosure, when the equivalent circuit of the semiconductor device is operated under switching, the Schottky barrier diode SBD connected with the body diode 10 in parallel can reduce the reverse recovery charge (Qrr) rapidly, thereby reducing the switching power loss (Psw). Especially for high-frequency electrical signals (for example, higher than 5.00E+04 hertz (Hz)), the semiconductor device 100 of the embodiments of the present disclosure has a better switching performance than the conventional semiconductor devices without the vertically embedded Schottky barrier diode. Moreover, the vertically embedded Schottky barrier diode SBD of the embodiments of the present disclosure is integrated in the semiconductor device 100, so that the cell pitch of the semiconductor device 100 is not increased. In addition, according to the embodiments of the present disclosure, the semiconductor device 100 does not need to dispose an additional Schottky barrier diode (SBD) chip with a metal-oxide-semiconductor field-effect-transistor (MOSFET) chip. According to the embodiments of the present disclosure, a metal-oxide-semiconductor field-effect-transistor (MOSFET) and a Schottky barrier diode (SBDs) are integrated in a single-chip structure, thereby saving more space while compared to the conventional double-chip structure of MOSFET and SBD.

According to the embodiments of the present disclosure, the first doped region 105-1 and the second doped region 105-2 of the semiconductor device 100 have the function of shielding regions, thereby reducing the electric field intensity of a specific region (for example, the bottom surface of the trench 106), and also reducing the gate-to-drain capacitance (Cgd). As shown in FIG. 1, both the first doped region 105-1 and the second doped region 105-2 are in contact with the dielectric liner 114 on the bottom surface of the trench 106. In some embodiments, the outer edge of the first doped region 105-1 and the outer edge of the second doped region 105-2 each protrudes beyond one edge of the trench 106, thereby reducing the electric field intensity of the dielectric liner 114 (also referred to as a gate dielectric layer) on the bottom surface of the trench 106, and also reducing the coupling area between the gate and the drain. Therefore, the gate-to-drain capacitance (Cgd) is reduced and the Schottky contact at the junction between the lower conductive portion 107 and the portion 104 of the epitaxial layer 103 is also protected by the first doped region 105-1 and the second doped region 105-2. Moreover, the lower conductive portion 107 and the upper conductive portion 109 of the semiconductor device 100 are separated from each other, and the lower conductive portion 107 is electrically coupled to the source contact 134, which can further reduce the gate-to-drain capacitance (Cgd), thereby reducing the switching loss of the semiconductor device 100.

Figure 2:
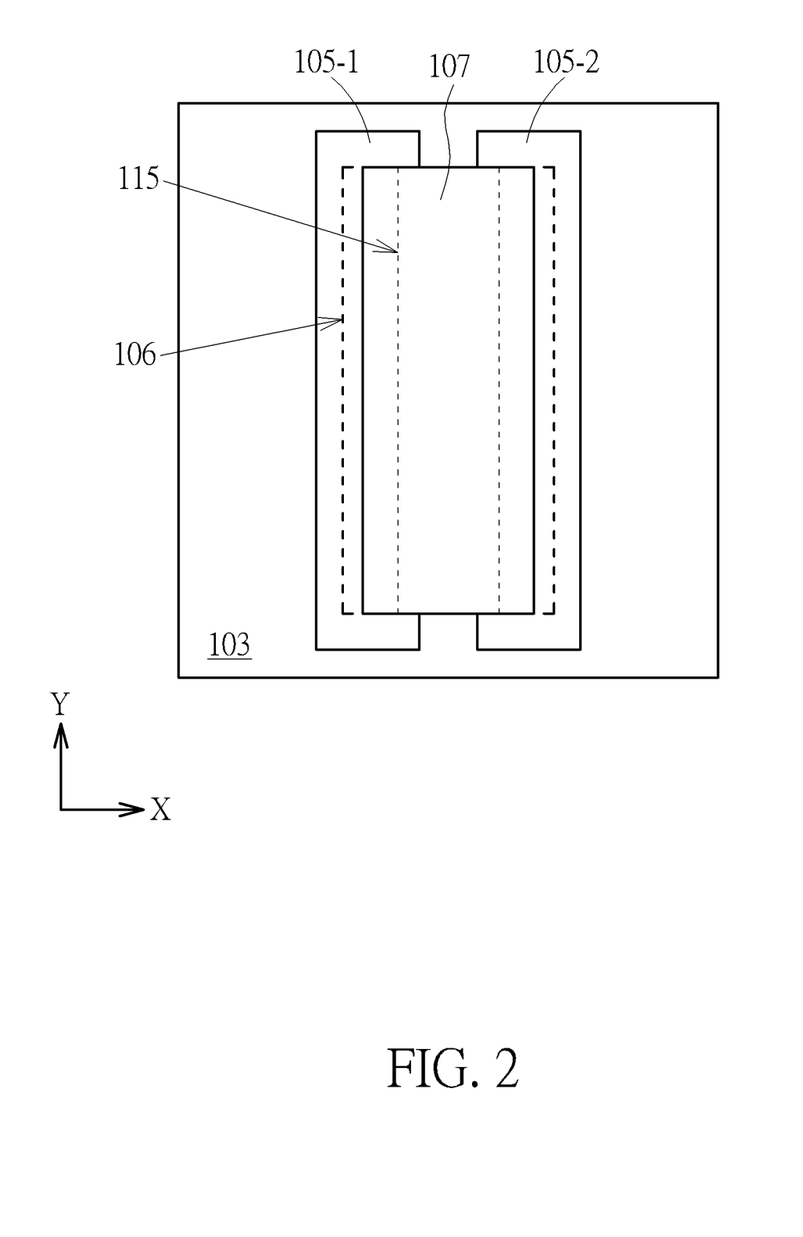
FIG. 2 is a schematic top view of some features of a semiconductor device according to an embodiment of the present disclosure.

FIG. 2 is a schematic top view of some features of a semiconductor device according to an embodiment of the present disclosure. As shown in FIG. 2, in one embodiment, when viewed from a top view, the first doped region 105-1 and the second doped region 105-2 of the semiconductor device 100 are located on two opposite sides of the lower conductive portion 107, respectively. Moreover, each of the first doped region 105-1 and the second doped region 105-2 overlaps with a part of the lower conductive portion 107, or further overlaps with the part of the lower conductive portion 107 filling up the opening 115 of the dielectric liner 114. The portion 104 of the epitaxial layer 103 is located between the first doped region 105-1 and the second doped region 105-2. In addition, each of the outer edge of the first doped region 105-1 and the outer edge of the second doped region 105-1 is extended beyond an edge of the trench 106. In this embodiment, in a plane direction (for example, the XY-plane direction) parallel to a surface of the substrate 101, the extension direction of the first doped region 105-1, the extension direction of the second doped region 105-2 and the extension direction of the lower conductive portion 107 are parallel to each other, for example, the Y-axis direction. Furthermore, in some embodiments, the shape of the opening 115 of the dielectric liner 114 in a top view may be a rectangle, and the first doped region 105-1 and the second doped region 105-2 may be located on two opposite sides of the opening 115. In addition, the shape of each of the first doped region 105-1 and the second doped region 105-2 in a top view may be a triangle, a rectangle, a polygon, a circle, an ellipse, or other suitable geometric shapes. In some embodiments, each of the first doped region 105-1 and the second doped region 105-2 may be composed of multiple portions separated from each other and arranged along the extension direction thereof (for example, the Y-axis direction). When viewed from a top view, each of the first doped region 105-1 and the second doped region 105-2 overlaps with a partial area of the lower conductive portion 107, a partial area of the trench 106 and a partial area of the opening 115.

Figure 3:
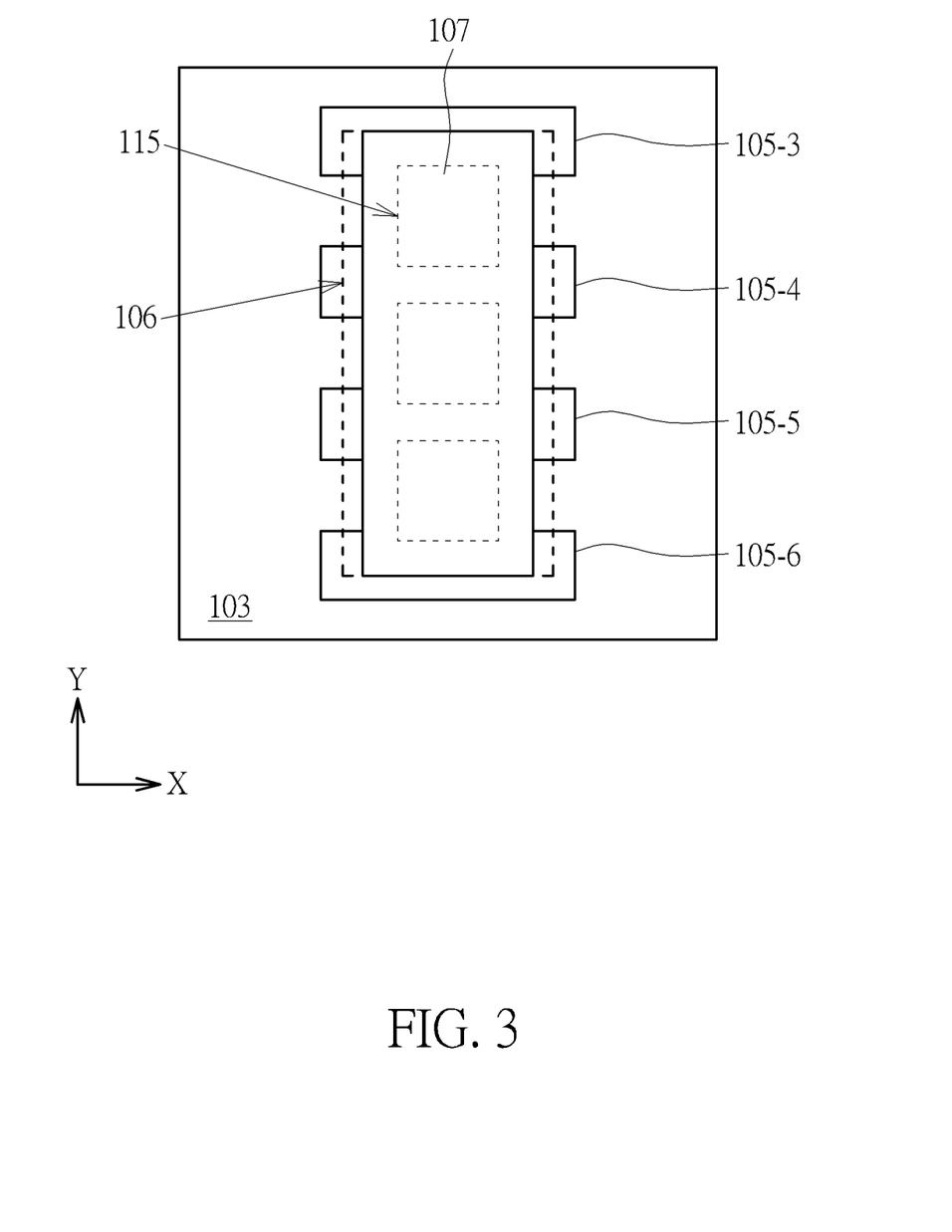
FIG. 3 is a schematic top view of some features of a semiconductor device according to another embodiment of the present disclosure.

FIG. 3 is a schematic top view of some features of a semiconductor device according to another embodiment of the present disclosure. As shown in FIG. 3, in this embodiment, the semiconductor device 100 includes a plurality of doped regions 105-3, 105-4, 105-5 and 105-6. These doped regions 105-3, 105-4, 105-5 and 105-6 all have the second conductivity type, for example, p-type doped regions. Please refer to FIG. 1, these doped regions 105-3, 105-4, 105-5 and 105-6 are disposed in the epitaxial layer 103 and located under the bottom surface of the trench 106. In a plane direction parallel to a surface of the substrate 101 (for example, the XY-plane direction), the extension directions of these doped regions 105-3, 105-4, 105-5 and 105-6 (for example, the X-axis direction) are parallel to each other, and all the extension directions thereof are perpendicular to the extension direction of the lower conductive portion 107 (for example, the Y-axis direction). In this embodiment, the doped regions 105-3 and 105-6 are located on two opposite sides of the lower conductive portion 107, respectively, and both the doped regions 105-4 and 105-5 are located between the doped region 105-3 and the doped region 105-6. The outer edges of the doped regions 105-3, 105-4, 105-5 and 105-6 are all beyond the edges of the trench 106. In some embodiments, the dielectric liner 114 may have a plurality of openings 115. The shape of each opening 115 in a top view may be a triangle, a rectangle, a polygon, a circle, an ellipse, or other suitable geometric shapes. These doped regions 105-3, 105-4, 105-5 and 105-6 may be disposed on two opposite sides of each opening 115. In addition, the shape of each doped region 105-3, 105-4, 105-5, and 105-6 in a top view may be a triangle, a rectangle, a polygon, a circle, an ellipse, or other suitable geometric shapes. In some embodiments, each of the doped regions 105-3, 105-4, 105-5, and 105-6 may be composed of multiple portions separated from each other and arranged along the extension direction thereof (for example, the X-axis direction). When viewed from a top view, each of the doped regions 105-3, 105-4, 105-5 and 105-6 overlaps with a partial area of the lower conductive portion 107, a partial area of the trench 106 and a partial area of the opening 115.

Figure 4:
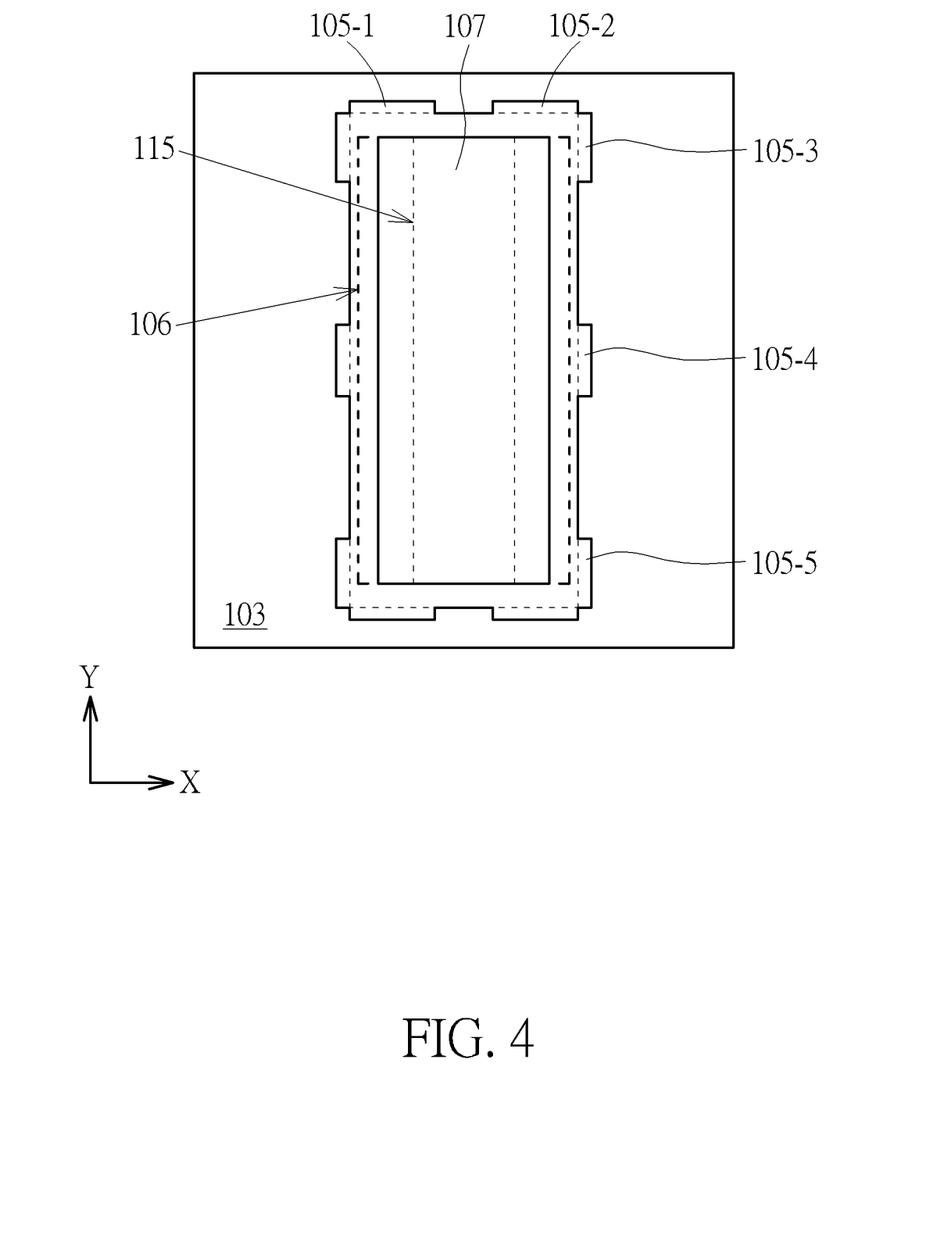
FIG. 4 is a schematic top view of some features of a semiconductor device according to further another embodiment of the present disclosure.

FIG. 4 is a schematic top view of some features of a semiconductor device according to further another embodiment of the present disclosure. As shown in FIG. 4, in this embodiment, the semiconductor device 100 includes a first doped region 105-1 and a second doped region 105-2 disposed in the epitaxial layer 103 and located under the bottom surface of the trench 106. In addition, a plurality of doped regions 105-3, 105-4 and 105-5 are further disposed in the epitaxial layer 103 and on the same level in the height as the first doped region 105-1 and the second doped region 105-2. These doped regions 105-1, 105-2, 105-3, 105-4 and 105-5 all have the second conductivity type, for example, p-type doped regions. These doped regions 105-1, 105-2, 105-3, 105-4 and 105-5 may be fabricated at the same time by using the same photo mask and the same ion implantation process. When viewed form a top view, in a plane direction parallel to a surface of the substrate 101 (for example, the XY-plane direction), the extension directions of the first doped region 105-1 and the second doped region 105-2 (for example, the Y-axis direction) are parallel to the extension direction of the lower conductive portion 107 (for example, the Y-axis direction). Moreover, the extension directions of these doped regions 105-3, 105-4 and 105-5 (for example, the X-axis direction) are parallel to each other and all perpendicular to the extension direction of the lower conductive portion 107 (for example, the Y-axis direction). The extension directions of the first doped region 105-1 and the second doped region 105-2 (for example, the Y-axis direction) are both perpendicular to the extension directions of the other doped regions 105-3, 105-4 and 105-5 (for example, the X-axis direction). In this embodiment, the placement of the first doped region 105-1 and the second doped region 105-2 can more effectively suppress the surface electric field of the Schottky contact. When viewed from a top view, each of these doped regions 105-1, 105-2, 105-3, 105-4, and 105-5 overlaps with a partial area of the lower conductive portion 107, a partial area of the trench 106, and a partial area of the opening 115 of the dielectric liner 114. The other details of the semiconductor device of FIG. 4 may refer to the aforementioned descriptions of FIG. 2 and FIG. 3, which will not be repeated here.

Figure 5:
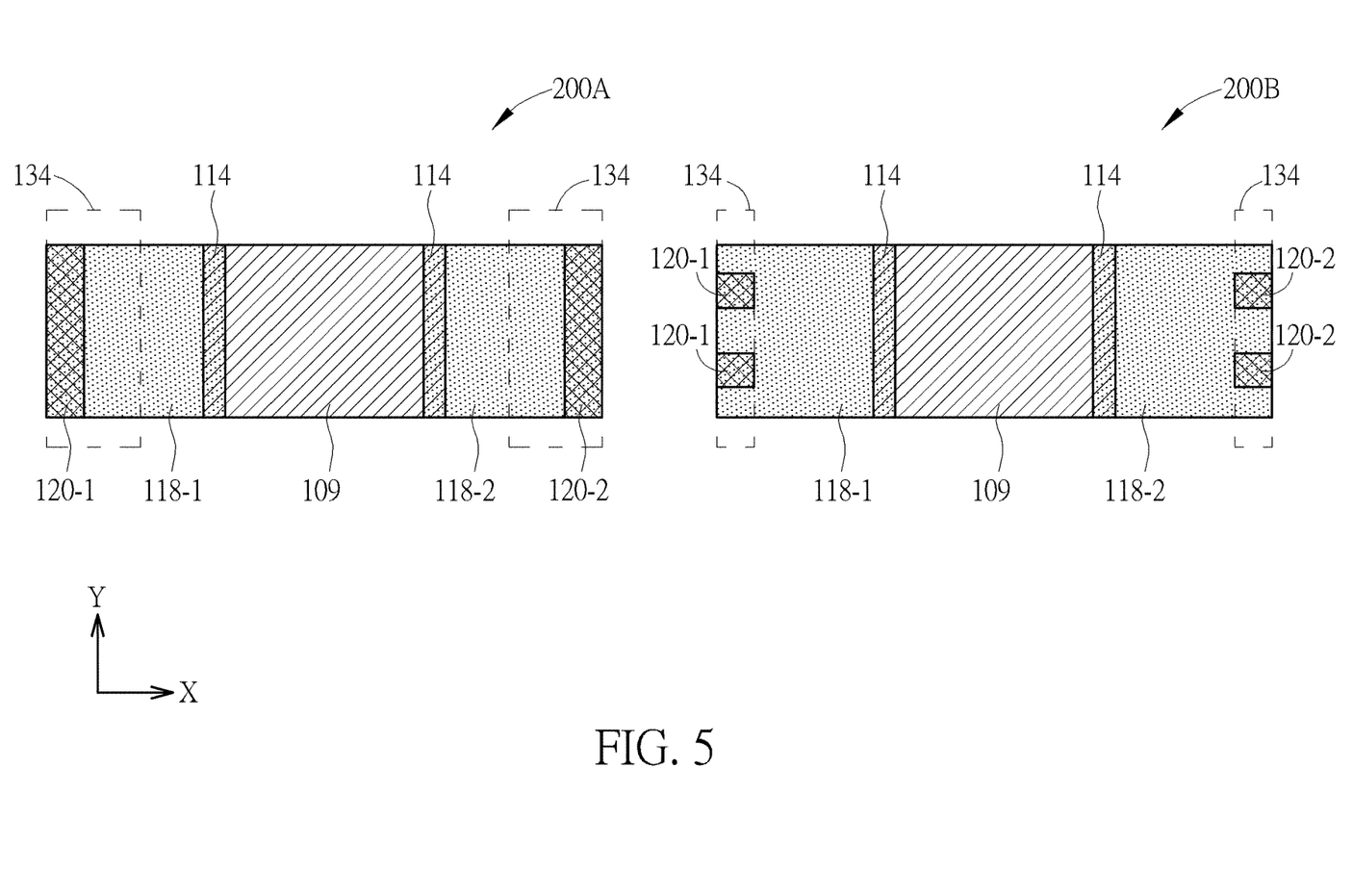
FIG. 5 shows two schematic top views of some other features of semiconductor devices according to some embodiments of the present disclosure.

FIG. 5 shows two schematic top views of the layout of other features of a semiconductor device according to some embodiments of the present disclosure. As shown in a layout 200A of FIG. 5, in one embodiment, the first source region 118-1 and the second source region 118-2 of the semiconductor device 100 are located on two opposite sides of the upper conductive portion 109, and separated from the upper conductive portion 109 by the dielectric liner 114. A first heavily doped region 120-1 is located outside the first source region 118-1, and a second heavily doped region 120-2 is located outside the second source region 118-2. When viewed from a top view, a source contact 134 overlaps the first heavily doped region 120-1 and a portion of the first source region 118-1, and another source contact 134 overlaps the second heavily doped region 120-2 and a portion of the second source region 118-2.

In addition, as shown in a layout 200B of FIG. 5, in this embodiment, the semiconductor device 100 includes multiple first heavily doped regions 120-1 disposed in the area of the first source region 118-1, and multiple second heavily doped regions 120-2 disposed in the area of the second source region 118-2. Compared with the embodiment of the layout 200A, in the embodiment of the layout 200B, the multiple first heavily doped regions 120-1 and the multiple second heavily doped regions 120-2 do not occupy additional area, so that the area of the source contact 134 of the embodiment of the layout 200B is smaller than the area of the source contact 134 of the embodiment of the layout 200A. Furthermore, the embodiment of the layout 200B may further reduce the cell pitch of the semiconductor device 100.

Figure 6:
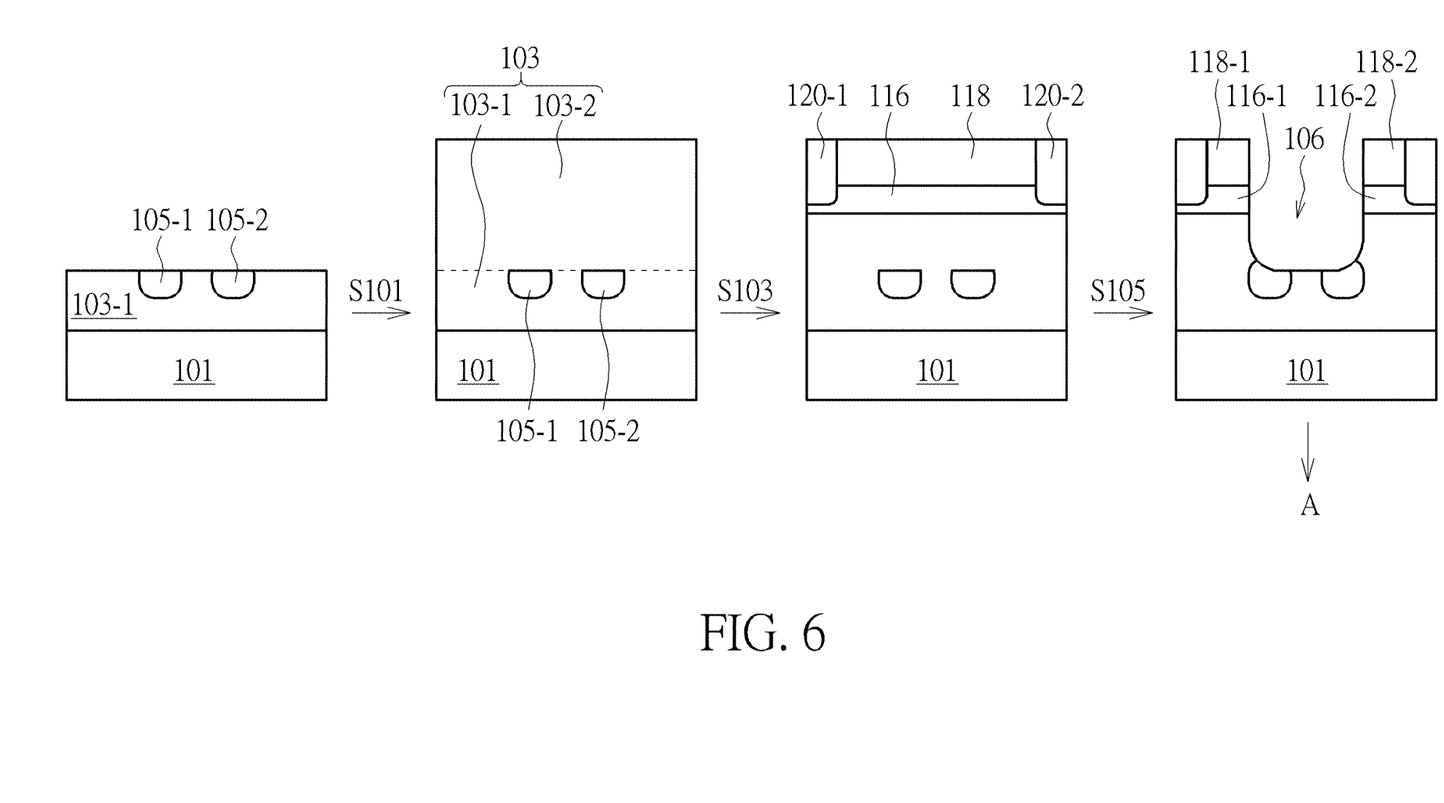
FIG. 6, FIG. 7, FIG. 8, FIG. 9 and FIG. 10 are schematic cross-sectional views of some stages of a method of fabricating a semiconductor device according to an embodiment of the present disclosure.

FIG. 6, FIG. 7, FIG. 8, FIG. 9 and FIG. 10 are schematic cross-sectional views of some stages of a method of fabricating a semiconductor device according to an embodiment of the present disclosure. As shown in FIG. 6, firstly, a substrate 101 such as a 4H-type single crystal silicon carbide (4H—SiC) substrate is provided, and then a first epitaxial layer 103-1 is formed on a surface such as the top surface of the substrate 101. The first epitaxial layer 103-1 may be formed by performing an epitaxial growth process with an ion implantation process of a first conductivity type together to make the first epitaxial layer 103-1 have the first conductivity type. The first epitaxial layer 103-1 is, for example, an n-type 4H-type single crystal silicon carbide (4H—SiC) epitaxial layer. Next, dopants of a second conductivity type are implanted in the first epitaxial layer 103-1 by using an ion implantation process with a mask to form a first doped region 105-1 and a second doped region 105-2, which are separated from each other and have the second conductivity type, for example, p-type doped regions. Still referring to FIG. 6, at step S101, a second epitaxial layer 103-2 of the first conductivity type is formed on the first epitaxial layer 103-1 by performing an epitaxial growth process with implanting a dopant of the first conductivity type at the same time. The second epitaxial layer 103-2 covers the first doped region 105-1 and the second doped region 105-2. The composition of the second epitaxial layer 103-2 may be the same as that of the first epitaxial layer 103-1. For example, the second epitaxial layer 103-2 may be a 4H—SiC epitaxial layer. The first epitaxial layer 103-1 and the second epitaxial layer 103-2 constitute the epitaxial layer 103 of FIG. 1.

Still referring to FIG. 6, at step S103, a well region 116 of the second conductivity type such as a p-type well region is firstly formed in the second epitaxial layer 103-2. Then, a source region 118 of the first conductivity type such as an n-type heavily doped region is formed in the well region 116 by using another ion implantation process and another mask. Next, a first heavily doped region 120-1 and a second heavily doped region 120-2 of the second conductivity type, for example, p-type heavily doped regions are formed in the well region 116. The first heavily doped region 120-1 and the second heavily doped region 120-2 are located on two opposite sides of the source region 118, respectively. Still referring to FIG. 6, at step S105, a trench 106 is formed to pass through the source region 118, the well region 116 and the second epitaxial layer 103-2 by using an etching process and a hard mask (not shown), where an etchant is used through the opening of the hard mask. Thereafter, a part of the first doped region 105-1, a part of the second doped region 105-2 and apart of the first epitaxial layer 103-1 are exposed through the bottom surface of the trench 106. Meanwhile, a first well region 116-1 and a second well region 116-2 as shown in FIG. 1 are formed on two opposite sides of the trench 106. In addition, a first source region 118-1 and a second source region 118-2 as shown in FIG. 1 are also formed on two opposite sides of the trench 106.

Figure 7:
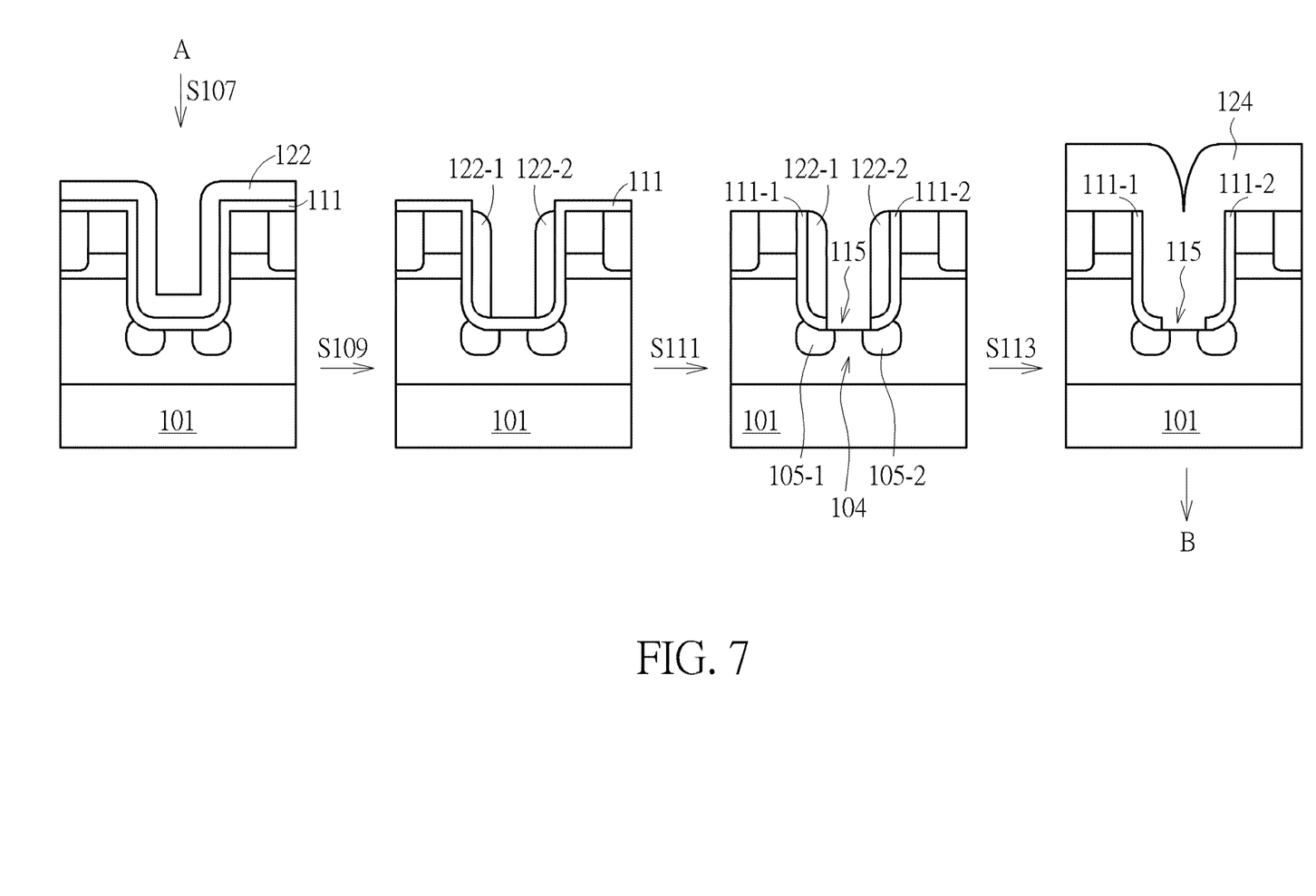

Next, referring to FIG. 7, at step S107, a first dielectric layer 111 and a second dielectric layer 122 are conformally deposited in sequence on the sidewalls and the bottom surface of the trench 106 and on the top surface of the epitaxial layer 103. In one embodiment, the first dielectric layer 111 is, for example, silicon oxide, and the second dielectric layer 122 is, for example, silicon nitride. Moreover, the thickness of the second dielectric layer 122 is greater than that of the first dielectric layer 111. The thickness of the second dielectric layer 122 is, for example, about 2 to 3 times the thickness of the first dielectric layer 111. Still referring to FIG. 7, at step S109, the horizontal portion of the second dielectric layer 122 is removed by an anisotropic etching process to form a first spacer 122-1 and a second spacer 122-2 on the first dielectric layer 111, and located on two opposite sidewalls of the trench 106, respectively.

Still referring to FIG. 7, at step S111, the first spacer 122-1 and the second spacer 122-2 are used as an etching mask and an etching process is performed on the first dielectric layer 111 to remove the portion of the first dielectric layer 111 not covered by the first spacer 122-1 and the second spacer 122-2. Thereafter, a portion 111-1 and a portion 111-2 of the first dielectric layer 111 are remained, and an opening 115 is formed to expose the portion 104 of the epitaxial layer 103, a portion of the first doped region 105-1 and a portion of the second doped region 105-2. Still referring to FIG. 7, at step S113, the first spacer 122-1 and the second spacer 122-2 are firstly removed by an etching process that has an etching selectivity to the materials of the first dielectric layer 111 and the second dielectric layer 122, and the portion 111-1 and the portion 111-2 of the first dielectric layer 111 are remained. Next, a first conductive material layer 124 is deposited in the trench 106 and on the top surface of the epitaxial layer 103. In addition, the opening 115 is filled up with the first conductive material layer 124, and the portions 111-1 and 111-2 of the first dielectric layer 111 are covered by the first conductive material layer 124. In some embodiments, the first conductive material layer 124 is, for example, Schottky metal or p-type doped polysilicon.

Figure 8:
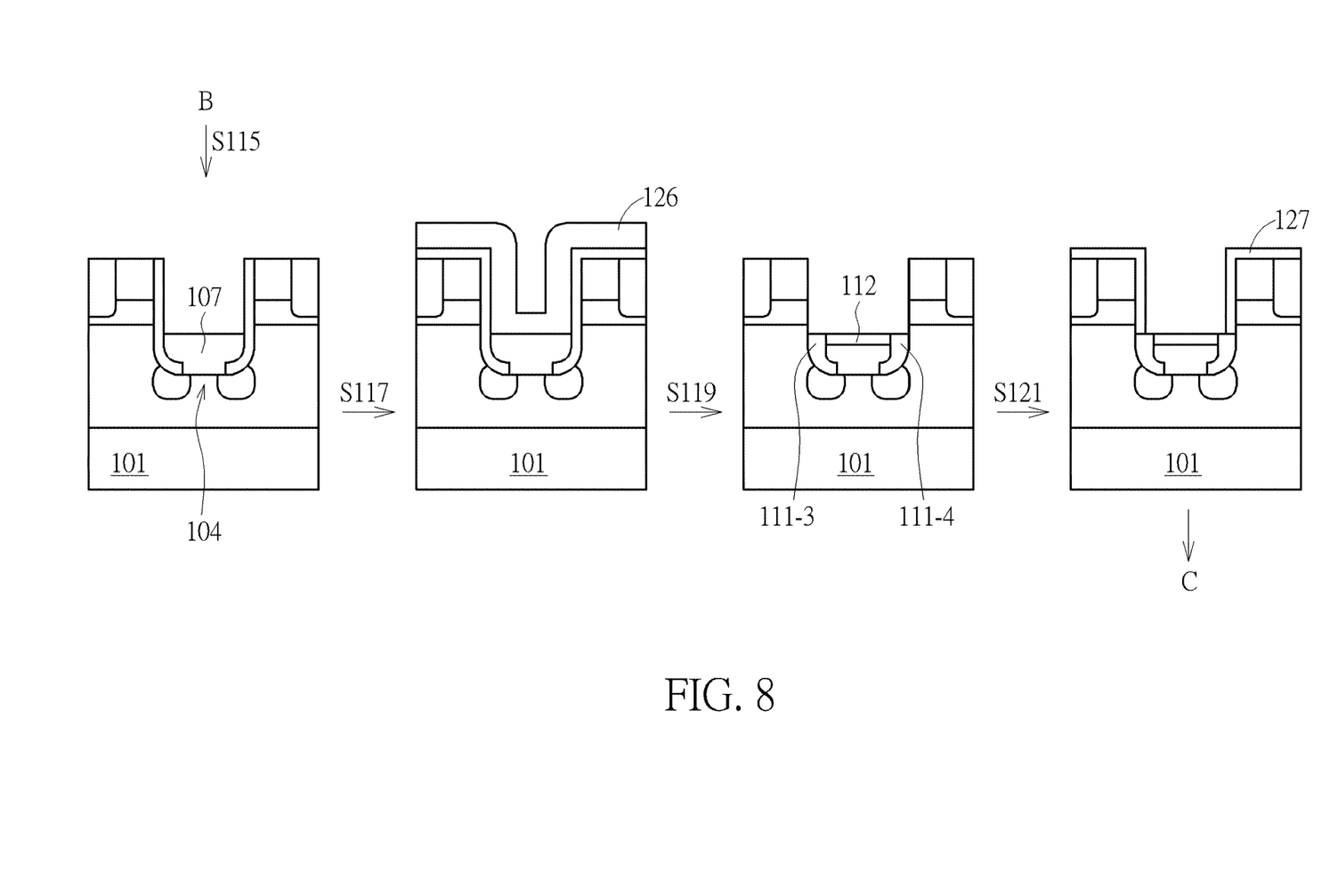

Then, referring to FIG. 8, at step S115, an etch-back process is performed on the first conductive material layer 124 to form a lower conductive portion 107 in the trench 106. The lower conductive portion 107 fills up the opening 115 and is in contact with the portion 104 of the epitaxial layer 103, a portion of the first doped region 105-1 and a portion of the second doped region 105-2 these are exposed by the opening 115. In some embodiments, the top surface of the lower conductive portion 107 is lower than the bottom surface of the first well region 116-1 and the bottom surface of the second well region 116-2. Still referring to FIG. 8, at step S117, a third dielectric layer 126 is deposited in the trench 106 and on the top surface of the epitaxial layer 103. The third dielectric layer 126 covers the lower conductive portion 107 and the portions 111-1 and 111-2 of the first dielectric layer 111. In some embodiments, the material of the third dielectric layer 126 may be the same as that of the first dielectric layer 111, for example, silicon oxide.

Still referring to FIG. 8, at step S119, an etch-back process is performed on the third dielectric layer 126 and the portions 111-1 and 111-2 of the first dielectric layer 111, so as to form a dielectric isolation portion 112 on the top surface of the lower conductive portion 107. Moreover, the top surfaces of the remaining portions 111-3 and 111-4 of the first dielectric layer 111 are level with the top surface of the dielectric isolation portion 112. Still referring to FIG. 8, at step S121, a fourth dielectric layer 127 is formed on the sidewalls of the trench 106 and on the top surface of the epitaxial layer 103 by using a thermal oxidation process. The fourth dielectric layer 127 is located on the top surfaces of the remaining portions 111-3 and 111-4 of the first dielectric layer 111. The fourth dielectric layer 127 is, for example, silicon oxide. In addition, the thickness of the fourth dielectric layer 127 is smaller than that of the first dielectric layer 111.

Figure 9:
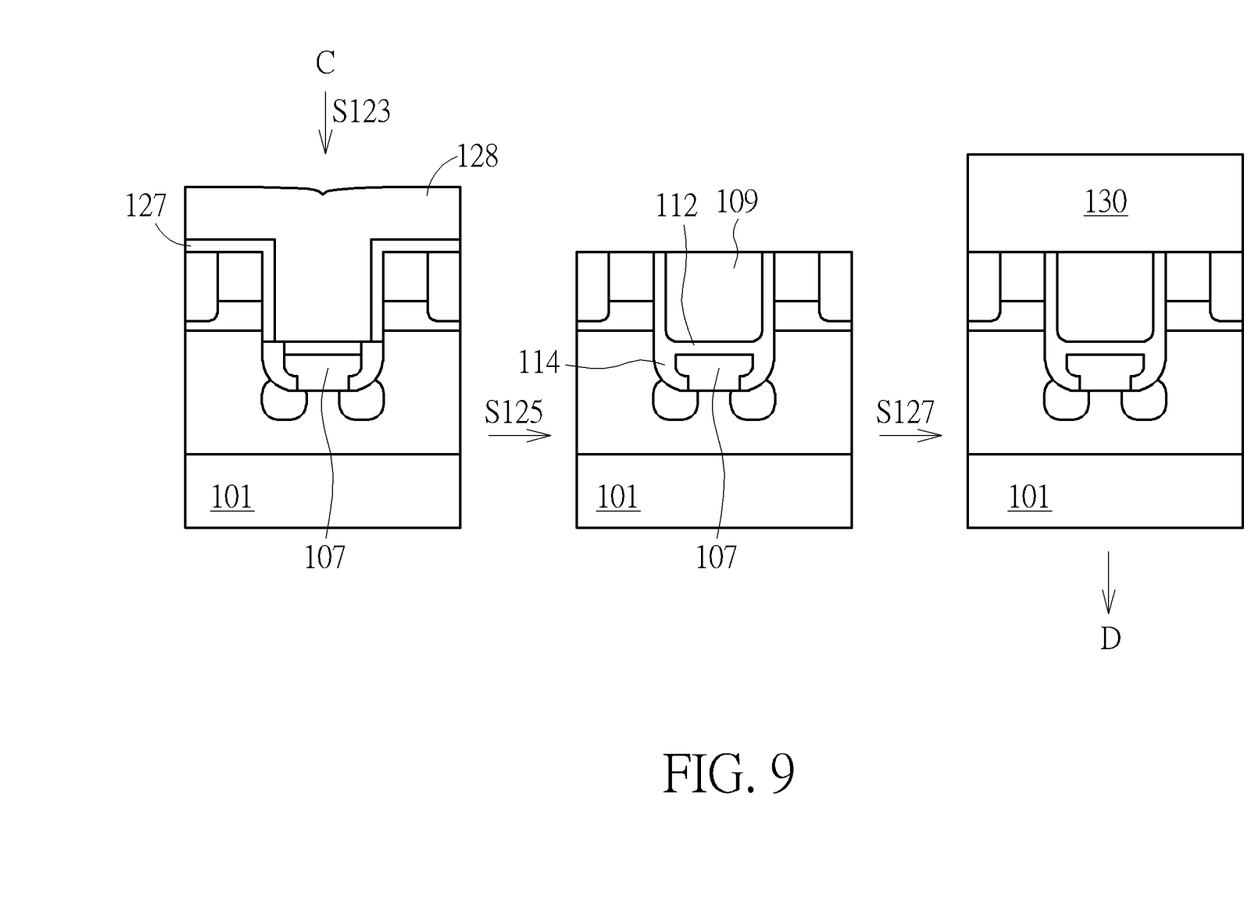

Then, referring to FIG. 9, at step S123, a second conductive material layer 128 is deposited on the fourth dielectric layer 127 and the dielectric isolation portion 112. The trench 106 is filled up with the second conductive material layer 128. Also, the second conductive material layer 128 is deposited on the top surface of the epitaxial layer 103. In some embodiments, the second conductive material layer 128 is, for example, polysilicon. Still referring to FIG. 9, at step S125, a chemical mechanical planarization (CMP) process is performed on the second conductive material layer 128 and the fourth dielectric layer 127 to remove the portions of the second conductive material layer 128 and the fourth dielectric layer 127 outside the trench 106, so as to form an upper conductive portion 109 and to complete a dielectric liner 114. Where, the dielectric liner 114 is composed of a part of the fourth dielectric layer 127 and apart of the first dielectric layer 111. The dielectric isolation portion 112 is composed of a part of the third dielectric layer 126. Moreover, the upper conductive portion 109 and the lower conductive portion 107 are separated from each other by the dielectric isolation portion 112. The dielectric liner 114 surrounds the upper conductive portion 109 and the lower conductive portion 107. Still referring to FIG. 9, at step S127, an interlayer dielectric layer 130 is formed to cover the upper conductive portion 109 and the epitaxial layer 103. The interlayer dielectric layer 130 may include multiple dielectric layers. In addition, multiple metal layers and multiple vias are formed in the interlayer dielectric layer 130 to pass through the multiple dielectric layers, so as to form an interconnect layer for electrical connection.

Figure 10:
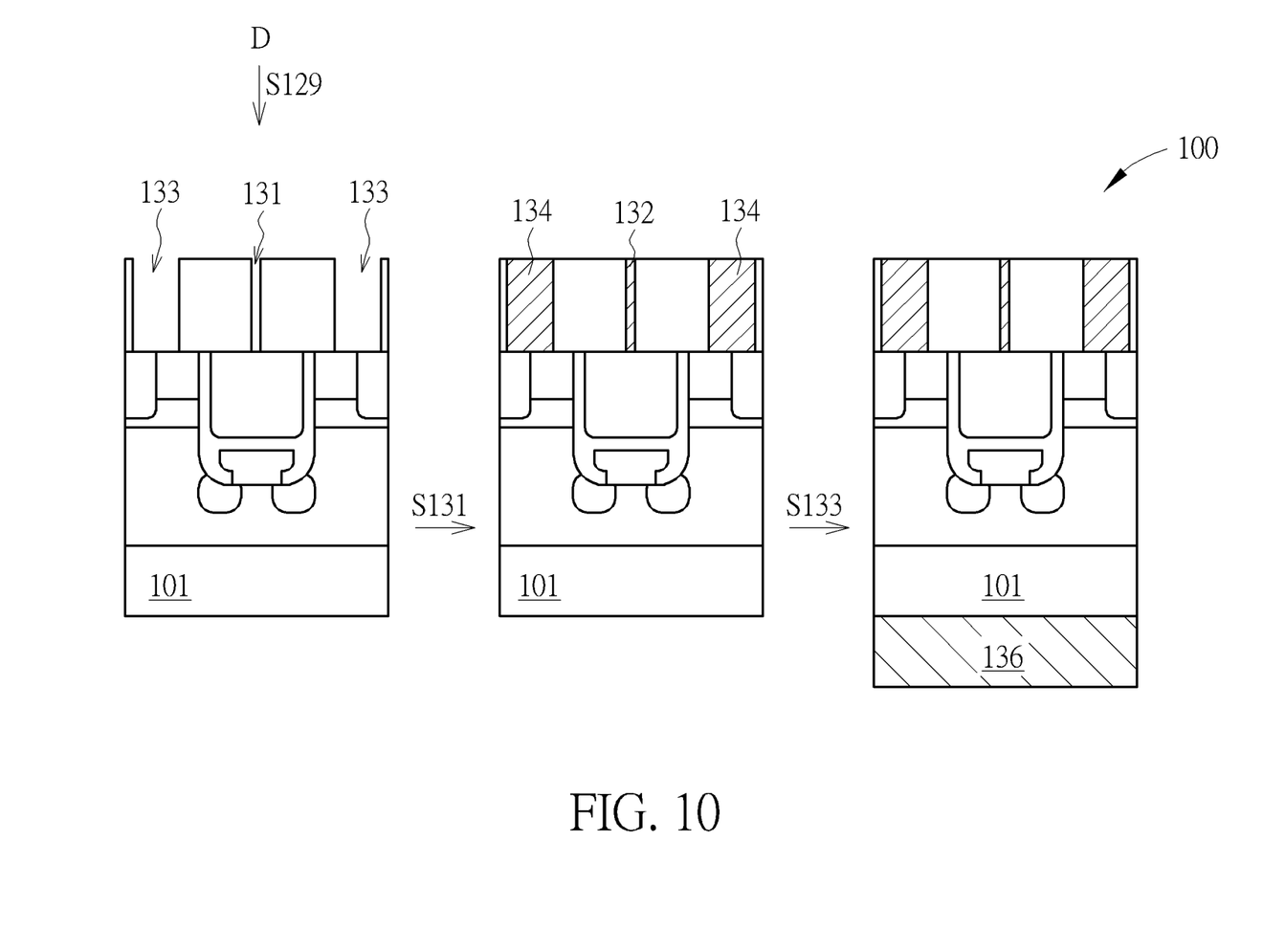

Next, referring to FIG. 10, at step S129, a plurality of contact openings 131 and 133 are formed in the interlayer dielectric layer 130 by using an etching process and a mask. Where, the contact opening 131 exposes a part of the upper conductive portion 109. A contact opening 133 exposes a part of the first source region 118-1 and a part of the first heavily doped region 120-1. Another contact opening 133 exposes a part of the second source region 118-2 and a part of the second heavily doped region 120-2. Still referring to FIG. 10, at step S131, a conductive material is deposited to fill up the contact openings 131 and 133, and then a CMP process is performed to form a gate contact 132 and multiple source contacts 134. Where, the gate contact 132 is electrically coupled to the upper conductive portion 109. The multiple source contacts 134 are electrically coupled to the first source region 118-1 and the second source region 118-2, respectively. In addition, the lower conductive portion 107 is also electrically coupled to the source contact 134. Still referring to FIG. 10, at step S133, a metal layer is deposited on a surface such as the bottom surface of the substrate 101 to form a drain electrode 136, so as to complete the semiconductor device 100 of FIG. 1.

According to the embodiments of the present disclosure, the semiconductor devices have a split gate trench structure, where the lower conductive portion of the gate is in contact with a portion of the epitaxial layer to construct a vertically embedded Schottky barrier diode (SBD). In addition, at least one doped region (or referred to as an offset doped region) is disposed on one side of this portion of the epitaxial layer. The conductivity type of the doped region is opposite to that of the epitaxial layer. The doped region has the function of a shielding region. Compared to other semiconductor devices that only have a split gate trench structure and one shielding region directly under the trench, but do not have a vertically embedded Schottky barrier diode and at least one offset shielding region, the semiconductor devices of the embodiments of the present disclosure can maintain the static performances and the dynamic performances, such as maintaining the threshold voltage (Vt), the on-state resistance (Ron), the breakdown voltage (BV), the reverse transfer capacitance (Crss), the high-frequency figure of merit (HF-FOM), and other performances. In addition, the semiconductor devices of the embodiments of the present disclosure can further improve the switching performance, such as reducing the reverse recovery current (Irr), the reverse recovery charge (Qrr), the turn-off energy dissipation (Eoff), the turn-on energy dissipation (Eon), the total switching loss, etc. by about 6% to 20%, especially operated under high-frequency electrical signals (for example, 1.00E+05 Hz). The semiconductor devices of the embodiments of the present disclosure can reduce the power loss by about 10.14% while compared with the aforementioned other semiconductor devices. Moreover, the semiconductor devices of the present disclosure can reduce more power loss when operated under higher frequency electrical signals. In addition, according to the embodiments of the present disclosure, the fabrication of the vertically embedded Schottky barrier diode of the semiconductor devices does not need an additional photo-mask, and the contact opening of the vertically embedded Schottky barrier diode may be formed by using a self-aligned process technology to save the fabrication cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   an epitaxial layer, having a first conductivity type and disposed on a first surface of the substrate;
   a trench, disposed in the epitaxial layer;
   a gate structure, disposed in the trench and including an upper conductive portion and a lower conductive portion;
   a dielectric isolation portion, disposed between the upper conductive portion and the lower conductive portion;
   a dielectric liner, disposed in the trench and surrounding the gate structure, wherein the dielectric liner has an opening located on a bottom surface of the trench, the opening is filled up with a part of the lower conductive portion, and the lower conductive portion and a portion of the epitaxial layer construct a Schottky barrier diode; and
   a first doped region, having a second conductivity type and disposed in the epitaxial layer, located under the bottom surface of the trench and on one side of the lower conductive portion,
   wherein the portion of the epitaxial layer and a portion of the first doped region both are in contact with the lower conductive portion.

2. The semiconductor device of claim 1, further comprising a second doped region having the second conductivity type and disposed in the epitaxial layer, located under the bottom surface of the trench and on another side of the lower conductive portion, wherein a portion of the second doped region is in contact with the lower conductive portion, the first doped region and the second doped region are separated from each other, and located on two opposite sides of the opening, respectively.

3. The semiconductor device of claim 2, wherein when viewed from a top view, each of the first doped region and the second doped region overlaps with a portion of the lower conductive portion, and the portion of the epitaxial layer is located between the first doped region and the second doped region.

4. The semiconductor device of claim 2, wherein both the first doped region and the second doped region are in contact with the dielectric liner located on the bottom surface of the trench, and when viewed from a top view, an outer edge of the first doped region and an outer edge of the second doped region each protrudes beyond an edge of the trench.

5. The semiconductor device of claim 2, wherein when viewed from a top view, in a plane direction parallel to the first surface of the substrate, extension directions of the first doped region, the second doped region and the lower conductive portion are all parallel to each other.

6. The semiconductor device of claim 2, wherein when viewed from a top view, in a plane direction parallel to the first surface of the substrate, extension directions of the first doped region and the second doped region are both perpendicular to an extension direction of the lower conductive portion.

7. The semiconductor device of claim 6, further comprising a third doped region having the second conductivity type, disposed in the epitaxial layer and under the bottom surface of the trench, wherein the third doped region is located between the first doped region and the second doped region, and the first doped region, the second doped region and the third doped region are on the same level at a height, when viewed from a top view, in a plane direction parallel to the first surface of the substrate, an extension direction of the third doped region is parallel to the extension directions of the first doped region and the second doped region.

8. The semiconductor device of claim 6, further comprising a third doping region and a fourth doping region, having the second conductivity type, disposed in the epitaxial layer and located under the bottom surface of the trench, wherein the first doped region, the second doped region, the third doped region and the fourth doped region are on the same level at a height, when viewed from a top view, in a plane direction parallel to the first surface of the substrate, extension directions of the third doped region and the fourth doped region are both perpendicular to the extension directions of the first doped region and the second doped region, and parallel to the extension direction of the lower conductive portion.

9. The semiconductor device of claim 1, further comprising:

a first well region and a second well region, having the second conductivity type, disposed in the epitaxial layer and located on two opposite sides of the trench, respectively;

a first source region and a second source region, having the first conductivity type and disposed in the first well region and the second well region, respectively; and a drain electrode, disposed on a second surface of the substrate.

10. The semiconductor device of claim 1, wherein the upper conductive portion is electrically coupled to a gate contact, and the lower conductive portion is electrically coupled to a source contact.

11. The semiconductor device of claim 1, wherein the composition of the lower conductive portion comprises a Schottky metal or a doped polysilicon, and the composition of the epitaxial layer comprises silicon carbide; or the composition of the lower conductive portion comprises a Schottky metal, and the composition of the epitaxial layer comprises silicon carbide, monocrystalline silicon or polysilicon.

12. The semiconductor device of claim 2, wherein a shape of the opening in a top view comprises a triangle, a rectangle, a polygon, a circle or an ellipse, and each of a shape of the first doped region and a shape of the second doped region in a top view comprises a triangle, a rectangle, a polygon, a circle, or an ellipse.

* * * * *